United States Patent
Nishimura et al.

(10) Patent No.: US 7,834,333 B2
(45) Date of Patent: Nov. 16, 2010

(54) CHARGED PARTICLE BEAM LITHOGRAPHY SYSTEM AND METHOD FOR EVALUATING THE SAME

(75) Inventors: Rieko Nishimura, Yokohama (JP); Shuichi Tamamushi, Fujisawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 559 days.

(21) Appl. No.: 11/855,613

(22) Filed: Sep. 14, 2007

(65) Prior Publication Data
US 2008/0067338 A1 Mar. 20, 2008

(30) Foreign Application Priority Data
Sep. 15, 2006 (JP) ............... 2006-250316

(51) Int. Cl.
*G21K 5/02* (2006.01)
(52) U.S. Cl. ............... 250/492.22; 250/492.21; 250/396 R
(58) Field of Classification Search ......... 250/396 R, 250/397, 398, 400, 491.1, 492.1, 492.2, 492.21, 250/492.22, 492.23, 492.3, 306, 307, 309, 250/310, 311; 430/296, 297, 298
See application file for complete search history.

(56) References Cited

U.S. PATENT DOCUMENTS

| | | | |
|---|---|---|---|
| 6,472,672 B1 * | 10/2002 | Muraki | 250/492.2 |
| 7,026,106 B2 * | 4/2006 | Chang | 430/394 |
| 2003/0094584 A1 * | 5/2003 | Yui et al. | 250/492.22 |
| 2003/0160192 A1 * | 8/2003 | Inanami et al. | 250/492.23 |
| 2004/0117757 A1 * | 6/2004 | Inanami et al. | 716/21 |
| 2005/0061981 A1 * | 3/2005 | Allen et al. | 250/353 |
| 2006/0289797 A1 * | 12/2006 | Inanami et al. | 250/492.2 |
| 2007/0278418 A1 * | 12/2007 | Zani et al. | 250/432 R |

* cited by examiner

*Primary Examiner*—Jack I Berman
*Assistant Examiner*—Nicole Ippolito Rausch
(74) *Attorney, Agent, or Firm*—Oblon, Spivak, McClelland, Maier & Neustadt, L.L.P.

(57) ABSTRACT

In the charged particle beam lithography system, a pattern area to be drawn is divided into a plurality of frames, a main deflection positions a charged particle beam to a subfield within the frame, and an auxiliary deflection draws a pattern in units of the subfield. The charged particle beam lithography system includes a beam optical system including a deflector deflecting the beam, a driver driving the deflector, and a deflection control portion controlling the driver according to drawing data indicating a pattern to be drawn. The deflection control portion controls the driver according to a settling time that is determined so that an offset of an irradiation position of the charged particle beam has a certain value irrespective of any changes in deflection amount of the auxiliary deflection in the subfield.

14 Claims, 5 Drawing Sheets

CHARGED PARTICLE BEAM LITHOGRAPHY SYSTEM AND METHOD FOR EVALUATING THE SAME

CROSS REFERENCE TO RELATED APPLICATIONS

This application is based on and claims the benefit of priority from prior Japanese Patent Application No. 2006-250316, filed on Sep. 15, 2006 the entire contents of which are incorporated herein by reference.

BACKGROUND OF THE INVENTION

1. Field of the Invention

The present invention relates to a charged particle beam lithography system and a method for evaluating the same.

2. Description of the Related Art

As semiconductor integrated circuits are highly integrated, LSI patterns are becoming much smaller and complicated. The light exposure is thus desired to use a much smaller exposure mask and reticle used for the LSI patterns. Another proposed method for dealing with such smaller LSI patterns directly draws the LSI pattern by the charged particle beam including an electron beam and an ion beam.

This charged particle beam lithography technology is generally not a batch exposure such as the light exposure using the LSI mask and the like, but a process that scans a substrate with a charged particle beam to draw a pattern thereon. The charged particle beam lithography technology thus takes a time to draw a pattern, providing less throughput.

Some methods are proposed for improving the throughput of the charged particle beam lithography system. Specifically, one method is a stage control method referred to as a step & repeat scheme. This scheme stops the stage during drawing and moves the stage to the next area when a pattern is drawn to a drawable area. The scheme may advantageously use a large charged particle beam deflection area, i.e., a drawable area. The scheme requires, however, time for actually drawing a pattern and additional time for moving to the next drawing area (a non-exposure time). Such a non-exposure time added to the total drawing time reduces the throughput.

Another proposed scheme continuously moves a stage to increase the throughput. This scheme divides the pattern to be drawn into strip-like areas referred to as "frames". Each frame is drawn while the stage is continuously moved. When the beam reaches the edge of the frame, the stage stepwise moves in a direction perpendicular to the direction of the continuous motion, and a pattern is drawn again while the stage is continuously moved in the opposite direction. This scheme requires a smaller charged-particle-beam deflection area than the step & repeat scheme because a pattern is drawn during the stage motion. This scheme may, however, increase the throughput because the stage stops only at the frame edge.

The charged particle beam may be deflected in a scheme combined with a vector scan scheme (two-dimensional scanning scheme), for further increasing the throughput. The vector scan scheme further divides the frame into areas referred to as "subfields". Only the necessary portion within the subfield is drawn by the deflected charged particle beam. Unlike the one-dimensional scanning scheme, the vector scan scheme does not scan a non-drawn portion with the turned-off charged particle beam, thus increasing the drawing speed. The vector scan scheme uses a main deflector and an auxiliary deflector. The main deflector positions the charged particle beam to the subfield. The auxiliary deflector draws the subfield by the charged particle beam.

JP 10-284392A describes a drawing method that increases drawing accuracy in the charged particle beam lithography system.

SUMMARY OF THE INVENTION

A charged particle beam lithography system according to an aspect of the present invention is a charged particle beam lithography system in which a pattern area to be drawn is divided into a plurality of frames, a main deflection positions a charged particle beam to a subfield within the frame, and an auxiliary deflection draws a pattern in units of the subfield, the lithography system comprising: a beam optical system including a deflector deflecting the beam; a driver driving the deflector; and a deflection control portion controlling the driver according to drawing data indicating a pattern to be drawn, the deflection control portion controlling the driver according to a settling time that is determined so that an offset of an irradiation position of the charged particle beam has a certain value irrespective of any changes in deflection amount of the auxiliary deflection in the subfield.

A charged particle beam lithography system according to another aspect of the present invention is a charged particle beam lithography system in which a pattern area to be drawn is divided into a plurality of frames, a main deflection positions a charged particle beam to a subfield within the frame, and an auxiliary deflection draws a pattern in units of the subfield, the lithography system comprising: a beam optical system including a deflector deflecting the beam; a driver driving the deflector; a deflection control portion controlling the driver according to drawing data indicating a pattern to be drawn; a sub-field deflection calculation portion computing a deflection amount of the auxiliary deflection in the subfield; a settling time setup unit determining, according to the deflection amount of the auxiliary deflection, a settling time of the charged particle beam in the auxiliary deflection so that an offset of an irradiation position of the charged particle beam is a certain value irrespective of any changes in the deflection amount of the auxiliary deflection in the subfield.

A method for evaluating a charged particle beam lithography system according to an aspect of the present invention is a method for evaluating a charged particle beam lithography system in which a pattern area to be drawn is divided into a plurality of frames, a main deflection positions a charged particle beam to a subfield within the frame, and an auxiliary deflection draws a pattern in units of the subfield, an irradiation pattern of the charged particle beam used for the evaluation being arranged on a first line and a second line including an intersection therebetween, the first and second lines being substantially perpendicular to each other, the method comprising: a first step of irradiating the charged particle beam to a first irradiation position at an intersection of the first and second lines, moving the charged particle beam from the first irradiation position to a second irradiation position in the first line, and irradiating the beam thereto; a second step of moving, after the first irradiation step, the charged particle beam from the second irradiation position to a third irradiation position in the second line, and irradiating the beam thereto; a third step of repeating, after the second irradiation step, the motion of the irradiation position along the first or second line and the irradiation of the charged particle beam, and the motion of the irradiation position between the first and second lines and the irradiation of the charged particle beam; and a fourth step of measuring an error between the irradiation pattern and an actual irradiation position of the charged particle beam to measure an offset of the deflection position in the subfield.

A method for evaluating a charged particle beam lithography system according to another aspect of the present invention is a method for evaluating a charged particle beam lithography system in which a pattern area to be drawn is divided into a plurality of frames, a main deflection positions a charged particle beam to a subfield within the frame, and an auxiliary deflection draws a pattern in units of the subfield, a plurality of shots of the charged particle beams being irradiated to the pattern, the shots including odd shots and even shots of the charged particle beams, the odd shot beams having less deflection than the even shot beams or the even shot beams having less deflection than the odd shot beams.

DETAILED DESCRIPTION OF THE EMBODIMENTS

First Embodiment

An embodiment of the present invention is described below.

Figure 1:
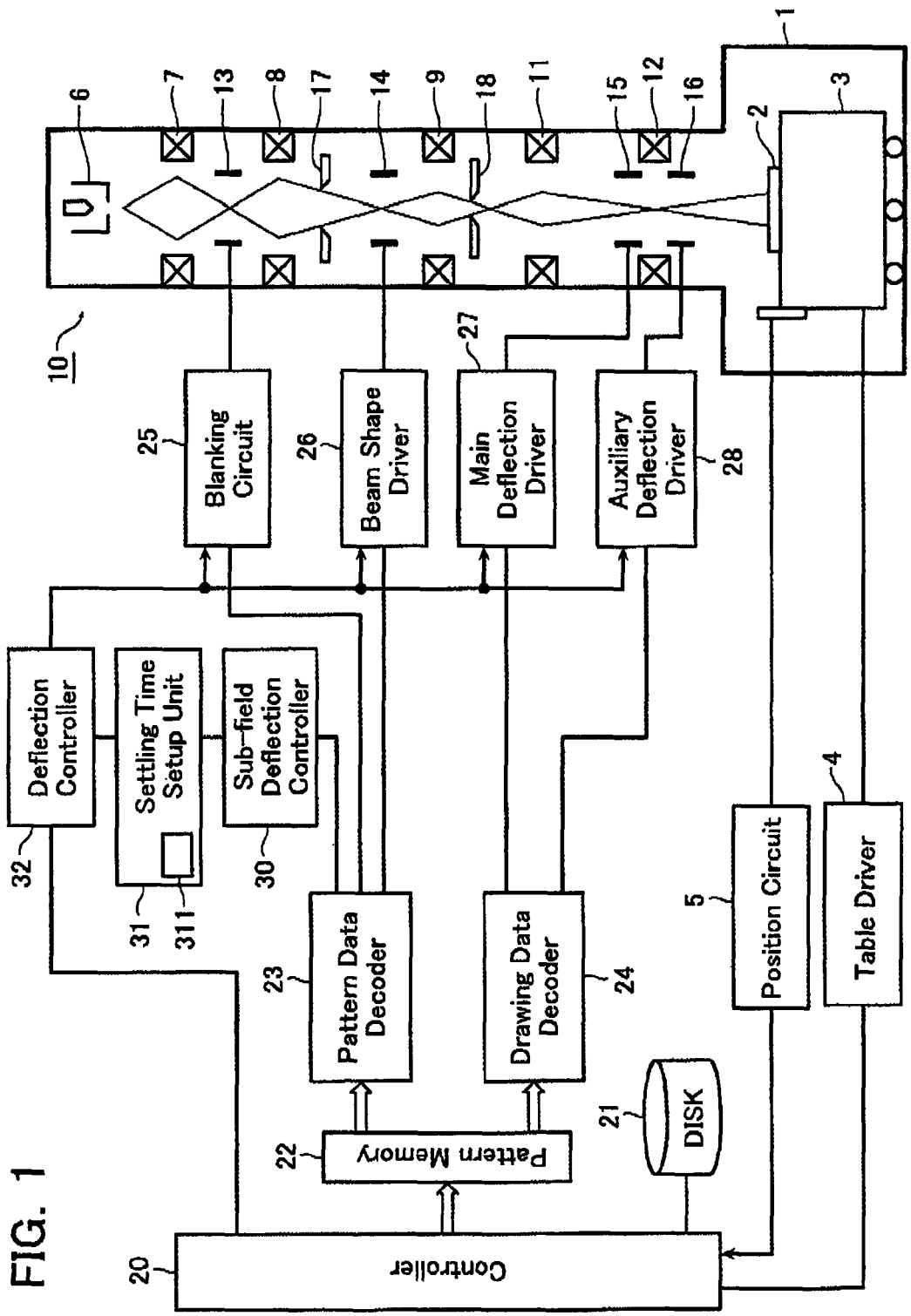
FIG. 1 is a configuration diagram of an electron beam lithography system in a first embodiment.

FIG. 1 is a configuration diagram of an electron beam lithography system according to a first embodiment of the present invention. The electron beam lithography system includes a sample chamber 1 that contains a stage 3 holding a sample 2 thereon. The sample 2 is, for example, a mask to which a pattern is drawn by the electron beam. The stage 3 is driven by a stage driver 4 in the X direction (the horizontal direction in the plane of FIG. 1) and in the Y direction (the vertical direction in the plane of FIG. 1). The position of the stage 3 is measured by a position circuit 5 including a laser distance meter or the like.

An electron beam optical system 10 resides above the sample chamber 1. The optical system 10 includes an electron gun 6, various lenses 7, 8, 9, 11, and 12, a blanking deflector 13, a beam-dimension adjusting deflector 14, a beam-scanning main deflector 15, a beam-scanning auxiliary deflector 16, and two beam-shaping apertures 17 and 18.

Figure 2:
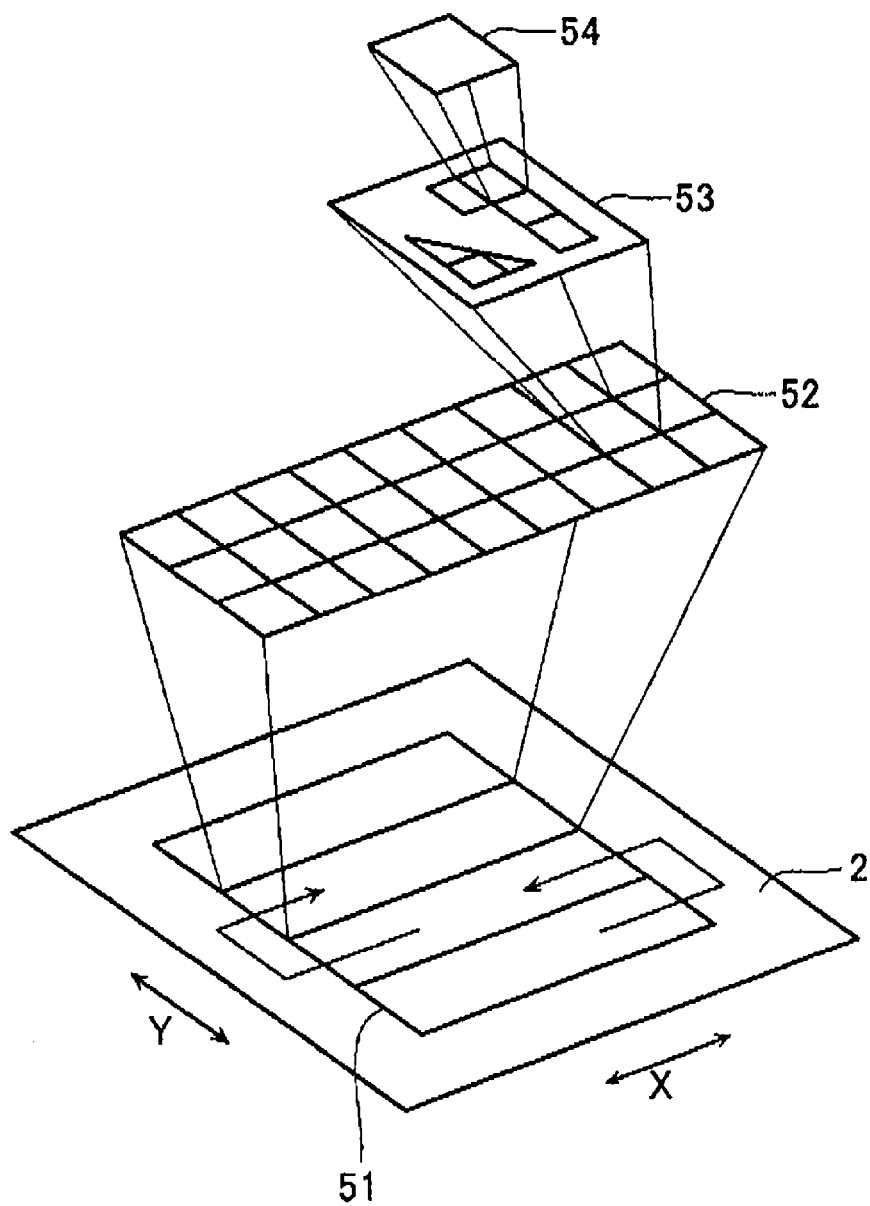
FIG. 2 illustrates an electron beam drawing method in a first embodiment.

Referring to FIG. 2, the system draws a pattern on the sample 2 by the electron beam as follows. A pattern 51 to be drawn on the sample 2 is divided into strip-like frame areas 52. Each frame area 52 is drawn, while the stage 3 is continuously moved in the X direction. The frame area 52 is further divided into subfield areas 53. Only the necessary portion within the sub-field area 53 is drawn by a deflected variable shaped beam such as an electron beam 54. The optical system 10 includes two deflectors: a main deflector 15 and an auxiliary deflector 16. The main deflector 15 positions the electron beam to the sub-field area 53. The auxiliary deflector 16 draws the sub-field area 53 by the electron beam.

The electron beam lithography system in this embodiment may draw a pattern on the sample as follows. The main deflector 15 positions the electron beam to a certain sub-field area 53. The auxiliary deflector 16 determines a pattern-drawing position within the certain sub-field area 53. The beam-dimension adjusting deflector 14 and the beam-shaping apertures 17 and 18 control the beam shape. The sub-field area 53 is drawn while the stage 3 is continuously moved in one direction. After one sub-field area 53 is thus drawn, the next sub-field area 53 is drawn. The frame area 52 is a strip-like drawing area defined by the deflection width of the main deflector 15. The sub-field area 53 is a unit drawing area defined by the deflection width of the auxiliary deflector 16.

After the frame area 52 including a plurality of subfield areas 53 is drawn, the stage 3 is moved stepwise in a direction perpendicular to the direction in which the stage 3 is continuously moved, and then the above processes are repeated. The frame areas 52 are thus sequentially patterned.

The controller 20 stores in its storage medium such as a magnetic disk 21 drawing data of a mask. After read from the magnetic disk 21, the drawing data is temporarily stored in the pattern memory 22 for each frame area 52. The pattern data for each frame area 52 stored in the pattern memory 22, i.e., frame information including drawing position and drawing figure data and the like is sent to a pattern data decoder 23 and a drawing data decoder 24 as a data analysis portion.

Output from the pattern data decoder 23 connects to a blanking circuit 25 and a beam shape driver 26. Specifically, the pattern data decoder 23 uses the pattern data to create blanking data. The blanking data is sent to the blanking circuit 25. The pattern data decoder 23 also creates desired beam-dimension data. The beam-dimension data is sent to the beam shape driver 26. The beam shape driver 26 sends a certain deflection signal to the beam-dimension adjusting deflector 14 in the electron optical system 10. The deflection signal controls a dimension of the electron beam.

The controller 20 also has a deflection controller 32 connected thereto. The deflection controller 32 connects to a settling time setup unit 31. The settling time setup unit 31 connects to a sub-field deflection calculator 30. The sub-field deflection calculator 30 connects to the pattern data decoder 23. The deflection controller 32 also connects to the blanking circuit 25, the beam shape driver 26, a main deflection driver 27, and an auxiliary deflection driver 28.

The drawing data decoder 24 sends its output to the main deflection driver 27 and the auxiliary deflection driver 28. The main deflection driver 27 sends a certain deflection signal to the main deflector 15 in the electron optical system 10. The deflection signal deflects the electron beam to a certain main deflection position. The auxiliary deflection driver 28 sends a certain auxiliary deflection signal to the auxiliary deflector 16. The auxiliary deflection signal causes the electron beam to draw a pattern in the sub-field area 53.

[Electron Beam Lithography Method]

A drawing method of an electron beam lithography system in this embodiment is described below.

The electron beam lithography system usually moves the electron beam, i.e., deflects the beam, to a certain position by applying a certain voltage to the deflector. The certain voltage cannot be applied quickly. It takes a time to reach the certain voltage. A settling time is thus set up. The settling time is a time necessary to stabilize the electric circuit such as a deflection amplifier in the deflector. The settling time corresponds to an interval between the electron-beam shots during drawing.

It is assumed that the settling time has a correlation with an amount of deflection (moving distance) of the electron beam. The settling time is thus usually set up to have a linear relationship between the settling time in the sub-field area 53 and the amount of the deflection of the electron beam in the sub field. In contrast, in this embodiment, the settling time is set up according to the amount of the deflection of the electron beam and the actual time for stabilizing the deflection amplifier. It is thus possible to irradiate the electron beam to a position more accurately and improve the throughput.

Figure 3:
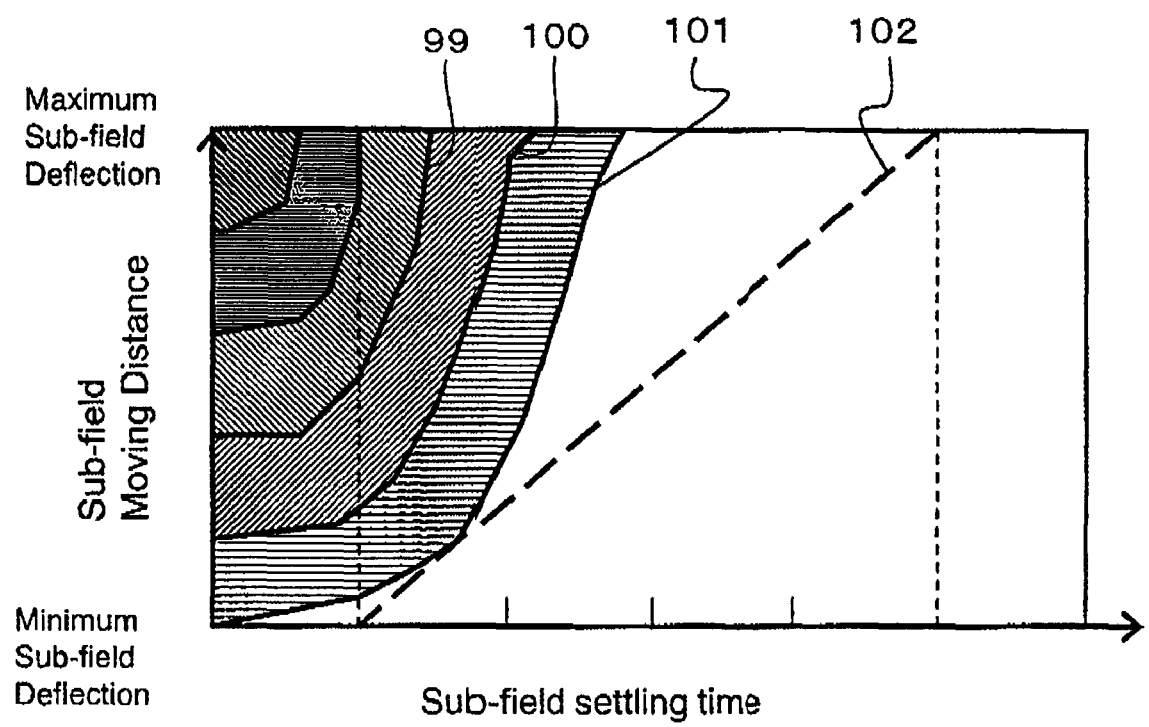
FIG. 3 is a correlation diagram between a moving distance in a subfield and a settling time.
Figure 3:
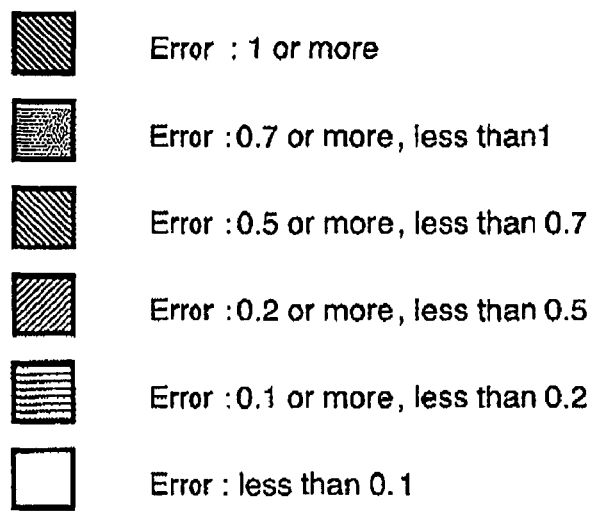

FIG. 3 shows a relationship between the amount of deflection of the electron beam and the settling time in the sub-field area 53. FIG. 3 relatively shows an error of a settling time with respect to an amount of the deflection of the electron beam (moving distance) in the sub-field area 53. Contours shown in FIG. 3 indicate relative values of the error. The contours sequentially show areas of, from the highest area, 1 or more, 0.7 or more, 0.5 or more, 0.2 or more, and 0.1 or more. As shown, in the vicinity of the maximum sub-field deflection amount of the electron beam in the sub-field area 53, a shorter settling time causes a larger error. The electron beam is thus irradiated to a position farther from the certain irradiation position.

In the sub-field area 53, the maximum error has a relative value (maximum value) of about 1.2. It is empirically known that an error equal to or less than $1/12$ of the maximum value may provide drawing with high accuracy. It is also empirically known that the throughput may benefit from an error equal to or more than $1/24$ of the maximum value, which is half of $1/12$ of the maximum value. For the high drawing accuracy and the high throughput, therefore, the settling time is preferably set up to provide an error between $1/12$ and $1/24$ of the maximum value, and more preferably, an error close to $1/12$ of the maximum value.

This embodiment therefore computes, according to the line 101 in FIG. 3 corresponding to the relative value of an error of 0.1 ($1/12$ of the maximum value), the settling time in the subfield from the subfield moving distance. This embodiment then uses the settling time to control the deflection in the subfield of the electron beam lithography system. It is thus possible to provide an electron beam lithography system having the high drawing accuracy and the high throughput.

In addition, when it is desired that a high drawing accuracy is sacrificed and instead a drawing speed is made high, it is possible to calculate a settling time based on lines 100 or 99, not the line 101, to conduct a deflection control in a subfield.

The drawing method of the electron beam lithography system thus configured is described below.

First, the sample 2 is disposed on the stage 3 in the sample chamber 1. The position of the stage 3 is then detected by the position circuit 5. Then, according to the signal from the controller 20, the stage driver 4 moves the stage 3 to a position that allows a pattern to be drawn on the sample 2.

The electron gun 6 then emits the electron beam. The electron beam is focused by a condenser lens 7. The blanking deflector 13 transmits the electron beam to the sample 2 or cut off the electron beam.

The electron beam is then incident on the aperture 17. The beam passes through the opening of the aperture 17. The beam is then deflected by the beam-dimension adjusting deflector 14 that is controlled by the beam shape driver 26. The beam then passes through the opening of the beam-shaping aperture 18. The electron beam is thus finally shaped to a desired beam shape such as a spot pattern. The spot pattern is a drawing unit of the electron beam irradiated to the sample 2. A plurality of spot patterns form one drawing pattern.

After the electron beam is shaped to the spot pattern, it is reduced by the reduction lens 11. A pattern is drawn on the sample 2 by irradiating the electron beam to the sample 2. The irradiation position on the sample 2 is controlled by the main deflector 15 and the auxiliary deflector 16. The deflection driver 27 controls the main deflector 15. The auxiliary deflection driver 28 controls the auxiliary deflector 16. The main deflector 15 positions the electron beam to a certain auxiliary deflection area (sub-field area 53) on the sample 2. The auxiliary deflector 16 controls the position where a pattern is to be drawn within the sub-field area 53.

A pattern is drawn on the sample 2 by the electron beam as follows. The stage 3 is moved in one direction, while the sample 2 is scanned by the electron beam, thus drawing a pattern in the sub-field area 53.

While the stage 3 is moved in one direction, a pattern is drawn in each sub-field area 53. The frame area 52 includes a plurality of sub-field areas 53. After patterns are drawn in the frame area 52, the stage 3 is moved to the new frame area 52. Similarly, patterns are drawn in the new frame area 52.

After patterns are completely drawn in the entire area of the sample 2 by the electron beam in this way, the sample 2 is replaced with a new sample. Patterns are drawn again on the new sample by the electron beam in a similar way.

A description is given of how the controller 20 controls the drawing.

The controller 20 reads the drawing data of the mask recorded in storage medium such as the magnetic disk 21. The controller 20 then temporarily stores the drawing data in the pattern memory 22 for each frame area 52.

The drawing data for each frame area 52 stored in the pattern memory 22 is the frame information including the drawing position and the drawing figure data and the like. The pattern memory 22 sends the drawing data to the pattern data decoder 23 and the drawing data decoder 24 as the data analysis portion. The decoders 23 and 24 then send the data to the sub-field deflection calculator 30, the blanking circuit 25, the beam shape driver 26, the main deflection driver 27, and the auxiliary deflection driver 28.

The pattern data decoder 23 creates, according to the drawing data, the blanking data. The decoder 23 then sends the blanking data to the blanking circuit 25. The decoder 23 also creates, according to the drawing data, the desired beam-shape data. The decoder 23 then sends the beam-shape data to the sub-field deflection calculator 30 and the beam shape driver 26.

The sub-field deflection calculator 30 computes, according to the beam-shape data created by the pattern data decoder 23, the amount of deflection (moving distance) of the electron beam for each shot in the sub-field area 53. The calculator 30 then sends the computed information to the settling time setup unit 31. The settling time setup unit 31 includes a table 311 indicating a relationship between the subfield moving distance and the settling time as shown in line 101 in FIG. 3. The settling time setup unit 31 refers to the table 311 and uses the line 101 in FIG. 3 to determine the settling time corresponding to the subfield moving distance.

The settling time setup unit 31 sends the determined settling time to the deflection controller 32 controlled by the controller 20. The controller 32 sends, synchronously with the pattern drawing, the settling time to one of the blanking circuit 25, the beam shape driver 26, the main deflection driver 27, and the auxiliary deflection driver 28.

The beam shape driver 26 applies a certain deflection signals to the beam-dimension adjusting deflector 14 in the optical system 10. The deflection signal controls the dimension of the electron beam.

The drawing data decoder 24 creates, according to the drawing data, subfield positioning data. The decoder 24 then sends the subfield positioning data to the main deflection driver 27.

The main deflection driver 27 applies a certain deflection signal to the main deflector 15. The deflection signal deflects the electron beam to a certain subfield position.

The drawing data decoder 24 generates, according to the drawing data, a control signal for scanning of the auxiliary deflector 16. The decoder 24 then sends the control signal to the auxiliary deflection driver 28. The auxiliary deflection driver 28 applies a certain auxiliary deflection signal to the auxiliary deflector 16. The auxiliary deflection signal allows the electron beam to be repeatedly irradiated onto the subfield area 53 after the set settling time has elapsed. A pattern is thus drawn in the area 53.

Thus, this embodiment allows the sub-field deflection calculator 30 and the settling time setup unit 31 to compute the moving distance of the electron beam in the drawing data in the sub-field area 53. Depending on the moving distance of the electron beam, this embodiment determines, referring to the table 311, the settling time so that the offset of the irradiation position of the electron beam has a certain value irrespective of any changes in the deflection amount of the auxiliary deflector. The throughput may thus be increased while maintaining the high drawing accuracy.

Specifically, this embodiment may provide a shorter total settling time than when the settling time is set up corresponding to the subfield moving distance according to the line 102 in FIG. 3, i.e., when the subfield moving distance and the settling time are set up in a linear relationship. This embodiment may thus increase the throughput of the electron beam lithography system.

Second Embodiment

A second embodiment of the present invention includes a method for evaluating a position accuracy in the electron beam lithography system. Specifically, the second embodiment includes a method for evaluating an irradiation position of the electron beam by the auxiliary deflector, i.e., a method for evaluating an irradiation position in the subfield.

Figure 4:
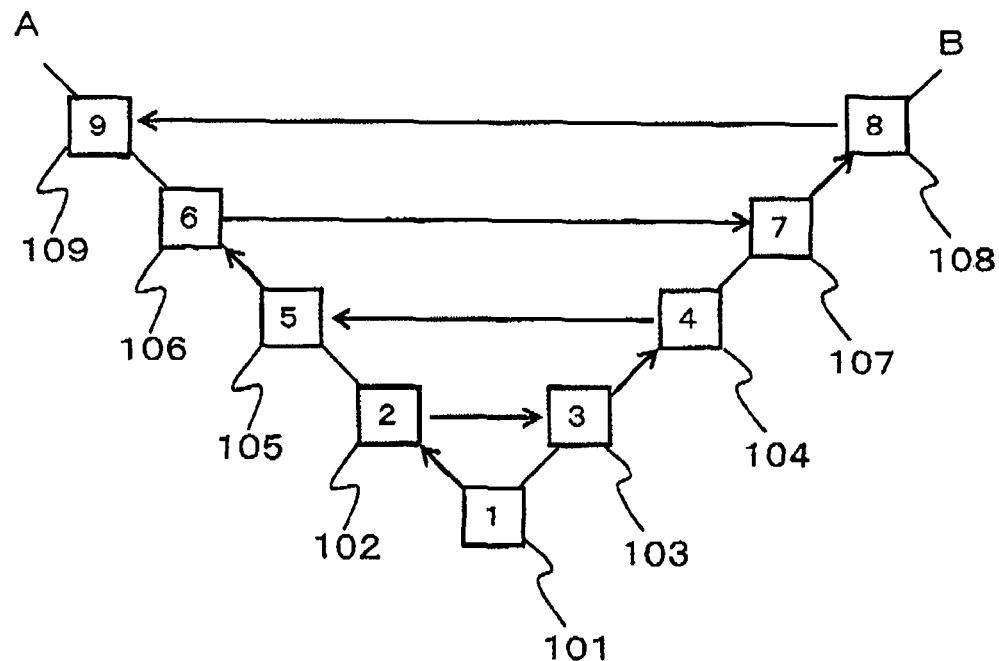
FIG. 4 illustrates an irradiation pattern used in an evaluation method in a second embodiment.

Referring to FIG. 4, this embodiment is described below.

Referring to FIG. 4, the irradiation position of the electron beam by the auxiliary deflector is evaluated by irradiating the electron beam to an irradiation position in an evaluation pattern including two perpendicular lines A and B. As necessary, a surface of the sample to be evaluated may be applied with a photosensitive material in advance that is sensitive to the electron beam and changes its characteristics when exposed to the beam.

Specifically, the electron beam is first irradiated to an irradiation position 101 at the intersection of the two lines A and B. The electron beam is then moved to an irradiation position 102 in the line A nearest to the position 101, and the electron beam is irradiated thereto (the first irradiation process). A constant settling time is set up to irradiate the electron beam.

After the electron beam is irradiated to the irradiation position 102, the electron beam is moved to the next irradiation position 103 in the line B, and is irradiated thereto (the second irradiation process). The moving distance from the irradiation position 102 to the irradiation position 103 is usually longer than the distance from the position 101 to the position 102 in the first irradiation process.

After the electron beam is irradiated to the irradiation position 103, the electron beam is moved to the next irradiation position 104 in the line B nearest to the position 103, and the electron beam is irradiated thereto (the third irradiation process). The moving distance from the irradiation position 103 to the irradiation position 104 substantially equals the distance from the position 101 to the position 102 in the first irradiation process.

After the electron beam is irradiated to the irradiation position 104, the electron beam is moved to the next irradiation position 105 in the line A and is irradiated thereto (the fourth irradiation process).

Similar operations are then repeated to irradiate the electron beam. Specifically, the electron beam is moved to the next irradiation position 106 in the same line A as the position 105 and is irradiated to the position 106 (the first irradiation process).

The electron beam is then moved to the next irradiation position 107 in the line B and is irradiated thereto (the second irradiation process).

The electron beam is then moved to the next irradiation position 108 in the same line B as the position 107 and is irradiated to the position 108 (the third irradiation process).

The electron beam is then moved to the next irradiation position 109 in the line A and is irradiated thereto (the fourth irradiation process).

After the above operations are performed on the entire evaluation pattern, the offset of the actual irradiation position of the electron-beam from the desired irradiation position is measured. The offset is used to evaluate an error. Specifically, after the sample is developed, the remaining or removed pattern of the photosensitive material is measured, comparing the pattern with the desired irradiation pattern, thus measuring the offset of the irradiation position of the electron beam.

The offset from the desired irradiation pattern may thus be measured to determine the error.

This embodiment alternately provides an irradiation position after a small deflection and an irradiation position after a large deflection, thus providing more accurate evaluation. The electron beam is irradiated after it is deflected for a certain settling time. If the previous irradiation is performed after insufficient settling time, the electron beam is irradiated to a position shifted from the correct irradiation position. In this case, the subsequent electron beam is irradiated after it is deflected relative to the previous irradiation position, thus gradually increasing the offset of the irradiation position. The settling time and the offset (error) of the irradiation position may thus not be determined accurately, thereby making it difficult to easily optimize the settling time.

Figure 5:
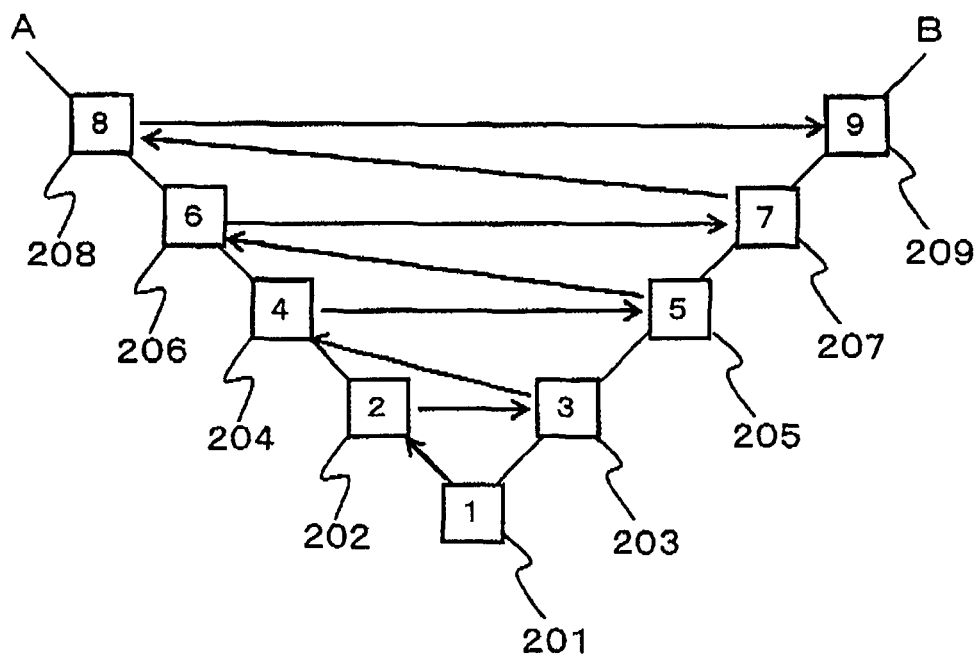
FIG. 5 illustrates an irradiation pattern used in an evaluation method of an electron beam lithography system.

To describe specifically, a comparison is made by describing a method for evaluating an irradiation position by alternately irradiating the electron beam as in FIG. 5 in the evaluation pattern including the two perpendicular lines A and B as in FIG. 4.

In this method, the electron beam is first irradiated to an irradiation position 201 at the intersection of the two lines. The electron beam is then moved to an irradiation position 202 in the line A adjacent to the position 201 and is irradiated thereto. The electron beam is then moved to an irradiation position 203 in the line B and is irradiated thereto. The electron beam is then moved to an irradiation position 204 in the line A and is irradiated thereto. The electron beam is then moved to an irradiation position 205 in the line B and is irradiated thereto. The electron beam is then moved to an irradiation position 206 in the line A and is irradiated thereto. The electron beam is then moved to an irradiation position 207 in the line B and is irradiated thereto. The electron beam is then moved to an irradiation position 208 in the line A and is irradiated thereto. The electron beam is then moved to an irradiation position 209 in the line B and is irradiated thereto. In this way, the electron-beam irradiation pattern is formed.

This method alternately irradiates the beam to the irradiation positions in the lines A and B. The electron beam deflection thus gradually increases, as shown in FIG. 5, every time the electron beam is irradiated. With the constant settling time, therefore, the greater is the deflection, the greater is the offset of the irradiation position of the electron beam. The offset of the irradiation position includes the offset of the previous irradiation position. It is thus difficult to accurately determine the relationship between the settling time and the offset of the irradiation position. Specifically, it is difficult for this method to detect only the offset that depends on the settling time.

Referring to FIG. 4, the evaluation method in this embodiment irradiates alternately and repeatedly the electron beam after a large deflection and the electron beam after a small deflection. The small-deflection electron beam is irradiated with little offset and a constant deflection, thereby giving no effect to the subsequent irradiation of the large-deflection electron beam. The relationship between the settling time and the error may thus be directly determined.

Figure 6:
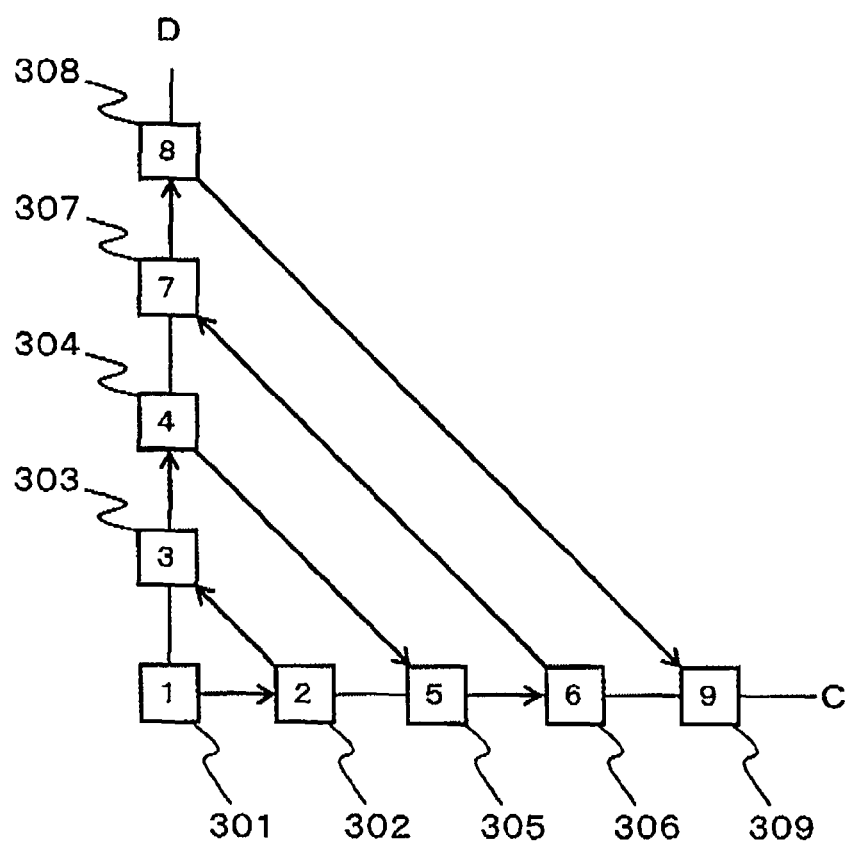
FIG. 6 illustrates another irradiation pattern used in an evaluation method in a second embodiment.

FIG. 6 shows another example of this embodiment. The irradiation pattern corresponds to the irradiation pattern in FIG. 4 that is rotated by 45 degree. An irradiation pattern including the substantially perpendicular lines C and D as shown in FIG. 6 is irradiated with the electron beam as in FIG. 4. Specifically, after the electron beam is irradiated to an irradiation position 301 at the intersection, the electron beam is moved to an irradiation position 302 in the line C and is irradiated thereto (the first irradiation process). The electron beam is then moved to an irradiation position 303 in the line D and is irradiated thereto (the second irradiation process). The electron beam is then moved to an irradiation position 304 in the same line D as the position 303 and is irradiated thereto (the third irradiation process). The electron beam is then moved to an irradiation position 305 in the line C and is irradiated thereto (the fourth irradiation process). The electron beam is then moved to an irradiation position 306 in the same line C as the position 305 and is irradiated thereto (the first irradiation process). The electron beam is then moved to an irradiation position 307 in the line D and is irradiated thereto (the second irradiation process). The electron beam is then moved to an irradiation position 308 in the same line D as the position 307 and is irradiated thereto (the third irradiation process). The electron beam is then moved to an irradiation position 309 in the line C and is irradiated thereto (the fourth irradiation process). In this way, the electron-beam irradiation pattern is formed.

As in FIG. 4, the following electron-beam motions are along the same line, and have short moving distances and small deflections: the electron beam motion from the irradiation position 301 to the irradiation position 302, the electron beam motion from the irradiation position 303 to the irradiation position 304, the electron beam motion from the irradiation position 305 to the irradiation position 306, and the electron beam motion from the irradiation position 307 to the irradiation position 308. The moving distances are substantially constant. A certain settling time may thus be set up to move the electron beam to the substantially accurate irradiation positions. The subsequent electron-beam deflections may thus give no effect to the following electron beam motions: the electron beam motion from the irradiation position 302 to the irradiation position 303, the electron beam motion from the irradiation position 304 to the irradiation position 305, the electron beam motion from the irradiation position 306 to the irradiation position 307, and the electron beam motion from the irradiation position 308 to the irradiation position 309. The directly correlation between the electron beam deflection and the error may thus be determined easily.

Figure 7:
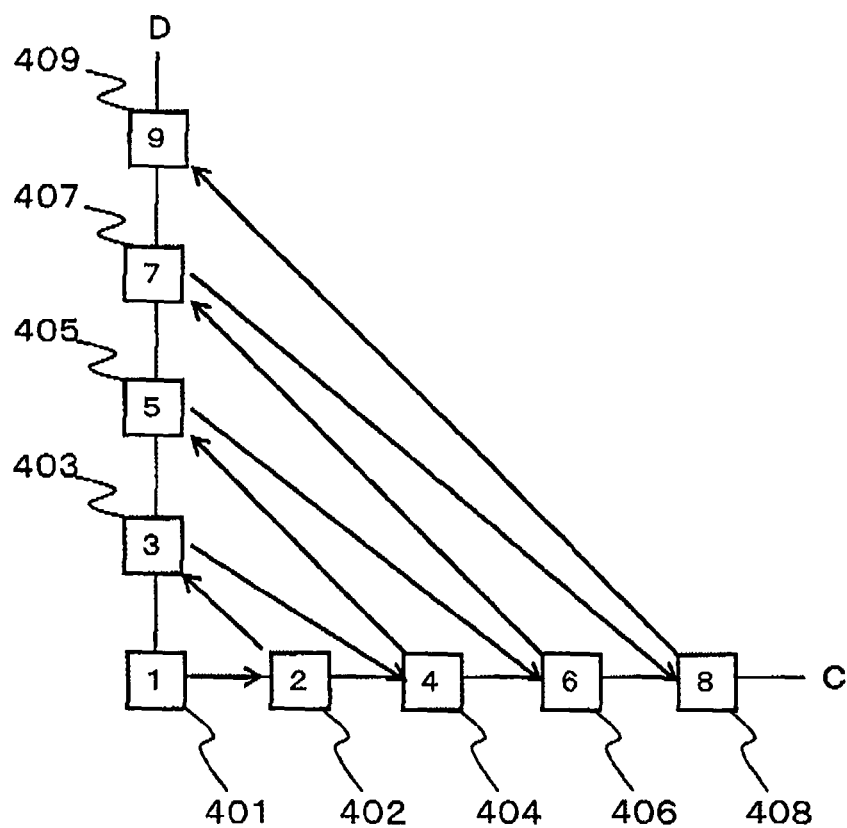
FIG. 7 illustrates another irradiation pattern used in an evaluation method of an electron beam lithography system.

In contrast, in FIG. 7, the irradiation patterns on the substantially perpendicular lines C and D as in FIG. 6 are irradiated with the electron beam as in FIG. 5. Specifically, after the electron beam is irradiated to an irradiation position 401 at the intersection, the electron beam is irradiated to the following positions in the following order, forming the electron-beam irradiation pattern: an irradiation position 402, an irradiation position 403, an irradiation position 404, an irradiation position 405, an irradiation position 406, an irradiation position 407, an irradiation position 408, and an irradiation position 409.

The electron beam is thus alternately irradiated to the irradiation positions in the lines C and D. Referring to FIG. 7, the electron beam travels a different distance in each motion, and the electron beam deflection increases every time the electron beam is irradiated. With the constant settling time, therefore, the irradiation position of the electron beam gradually shifts from the original desired irradiation position. The subsequent electron beam is irradiated after it is deflected relative to the previous position. The error of the irradiation position of the electron beam thus includes the offset of the irradiation position of the previous electron beam. It is thus difficult to directly understand the relationship between the settling time and the error.

The electron beam may thus be irradiated for evaluation using the methods in this embodiment shown in FIGS. 4 and 6, thereby easily determining the direct relationship between the settling time and the error.

Because the direct relationship between the settling time and the error is obtained, it is possible to easily optimize the settling time.

Thus, an electron beam lithography system and a method for evaluating the same according to preferred embodiments of the present invention have been described in detail, but the present invention is not limited to the disclosed embodiments, and other embodiments may also be possible.

What is claimed is:

1. A charged particle beam lithography system in which a pattern area to be drawn is divided into a plurality of frames, a main deflection positions a charged particle beam to a subfield within the frame, and an auxiliary deflection draws a pattern in units of the subfield, the lithography system comprising:
   a beam optical system including a deflector deflecting the beam;
   a driver driving the deflector; and
   a deflection control portion controlling the driver according to drawing data indicating a pattern to be drawn,
   the deflection control portion controlling the driver according to a settling time that is determined so that an offset of an irradiation position of the charged particle beam has a constant value irrespective of any changes in deflection amount of the auxiliary deflection in the subfield.

2. The charged particle beam lithography system according to claim 1, wherein
   the constant value of the offset of the irradiation position is set to be between $1/24$ and $1/12$ of a maximum value of the offset of the irradiation position that may occur in the subfield.

3. The charged particle beam lithography system according to claim 1, further comprising a stage holding a sample thereon, the stage being continuously movable in a first direction and being stepwise movable in a second direction perpendicular to the first direction, wherein the deflector comprises a main deflector positioning the beam to one of the subfields when the stage moves in the first direction, and an auxiliary deflector positioning the beam in the subfield.

4. The charged particle beam lithography system according to claim 3, wherein the frame is a strip-like area defined by a deflection width of the main deflector and the subfield is an area defined by a deflection width of the auxiliary deflector.

5. The charged particle beam lithography system according to claim 4, wherein the constant value of the offset of the irradiation position is set to be between $1/24$ and $1/12$ of a maximum value of the offset of the irradiation position that may occur in the subfield.

6. The charged particle beam lithography system according to claim 1, further comprising:

a sub-field deflection calculation portion computing a deflection amount of the auxiliary deflection in the subfield; and a settling time setup unit determining, according to the deflection amount of the auxiliary deflection, the settling time so that the offset of the irradiation position of the charged particle beam has a certain value irrespective of any changes in the deflection amount of the auxiliary deflection.

7. A charged particle beam lithography system in which a pattern area to be drawn is divided into a plurality of frames, a main deflection positions a charged particle beam to a subfield within the frame, and an auxiliary deflection draws a pattern in units of the subfield, the lithography system comprising:

a beam optical system including a deflector deflecting the beam;

a driver driving the deflector;

a deflection control portion controlling the driver according to drawing data indicating a pattern to be drawn;

a sub-field deflection calculation portion computing a deflection amount of the auxiliary deflection in the subfield;

a settling time setup unit determining, according to the deflection amount of the auxiliary deflection, a settling time of the charged particle beam in the auxiliary deflection so that an offset of an irradiation position of the charged particle beam has a constant value irrespective of any changes in the deflection amount of the auxiliary deflection in the subfield.

8. The charged particle beam lithography system according to claim 7, wherein the constant value of the offset of the irradiation position is set to be between $1/24$ and $1/12$ of a maximum value of the offset of the irradiation position that may occur in the subfield.

9. The charged particle beam lithography system according to claim 7, further comprising:

a stage holding a sample thereon, the stage being continuously movable in a first direction and being stepwise movable in a second direction perpendicular to the first direction, wherein the deflector comprises a main deflector positioning the beam to one of the subfields when the stage moves in the first direction, and an auxiliary deflector positioning the beam in the subfield.

10. The charged particle beam lithography system according to claim 9, wherein the frame is a strip-like area defined by a deflection width of the main deflector and the subfield is an area defined by a deflection width of the auxiliary deflector.

11. The charged particle beam lithography system according to claim 10, wherein the constant value of the offset of the irradiation position is set to be between $1/24$ and $1/12$ of a maximum value of the offset of the irradiation position that may occur in the subfield.

12. A method for evaluating a charged particle beam lithography system in which a pattern area to be drawn is divided into a plurality of frames, a main deflection positions a charged particle beam to a subfield within the frame, and an auxiliary deflection draws a pattern in units of the subfield, an irradiation pattern of the charged particle beam used for the evaluation being arranged on a first line and a second line including an intersection therebetween, the first and second lines being substantially perpendicular to each other, the method comprising:

first irradiating the charged particle beam to a first irradiation position at an intersection of the first and second lines, moving the charged particle beam from the first irradiation position to a second irradiation position in the first line, and irradiating the beam thereto;

second moving, after the first irradiation, the charged particle beam from the second irradiation position to a third irradiation position in the second line, and irradiating the beam thereto;

repeating, after the second irradiation, moving the irradiation position along the first or second line and irradiating the charged particle beam thereto, and moving the irradiation position between the first and second lines and irradiating the charged particle beam thereto; and measuring an error between the irradiation pattern and an actual irradiation position of the charged particle beam to measure an offset of the deflection position in the subfield.

13. The method for evaluating a charged particle beam lithography system according to claim 12, wherein a moving distance of the deflection amount of the charged particle beam in the first irradiation is less than a moving distance of the deflection amount of the charged particle beam in the second moving and irradiation.

14. A method for evaluating a charged particle beam lithography system comprising:

dividing a pattern area to be drawn into a plurality of frames, positioning by a main deflection a charged particle beam to a subfield within the frame, and drawing by an auxiliary deflection a pattern in units of the subfield, irradiating a plurality of shots of the charged particle beams to the pattern, the shots including odd shots and even shots of the charged particle beams, the odd shot beams having less deflection amount than the even shot beams or the even shot beams having less deflection amount than the odd shot beams.

* * * * *